United States Patent
Hsieh et al.

(10) Patent No.: US 9,703,058 B2
(45) Date of Patent: Jul. 11, 2017

(54) PACKAGE FRAMEWORK FOR PHOTOELECTRIC CONVERSION MODULE

(71) Applicant: National Applied Research Laboratories, Hsinchu (TW)

(72) Inventors: Chao-Ping Hsieh, Hsinchu (TW); Yin-Cheng Chang, Hsinchu (TW); Ta-Yeh Lin, Hsinchu (TW); Da-Chiang Chang, Hsinchu (TW)

(73) Assignee: NATIONAL APPLIED RESEARCH LABORATORIES, Hsinchu (TW)

( * ) Notice: Subject to any disclaimer, the term of this patent is extended or adjusted under 35 U.S.C. 154(b) by 0 days.

(21) Appl. No.: 15/002,003

(22) Filed: Jan. 20, 2016

(65) Prior Publication Data

US 2017/0131494 A1   May 11, 2017

(30) Foreign Application Priority Data

Nov. 10, 2015   (TW) ............... 104137030 A

(51) Int. Cl.
*G02B 6/42* (2006.01)
*G02B 6/43* (2006.01)
*H04B 10/80* (2013.01)

(52) U.S. Cl.
CPC ......... *G02B 6/4281* (2013.01); *G02B 6/4246* (2013.01); *G02B 6/4277* (2013.01); *G02B 6/43* (2013.01); *H04B 10/802* (2013.01)

(58) Field of Classification Search
CPC .......... H04B 10/25753; H04B 10/1125; H04B 10/25752; H04B 10/25759; H04B 10/802; H04W 88/085; G02B 6/4281; G02B 6/4264; G02B 6/43; G02B 6/4277

See application file for complete search history.

(56) References Cited

U.S. PATENT DOCUMENTS

| | | | |
|---|---|---|---|
| 2005/0018994 A1 | 1/2005 | Riaziat et al. | |
| 2005/0062123 A1 | 3/2005 | Weigert | |
| 2007/0058980 A1* | 3/2007 | Hidaka | G02B 6/4201 398/138 |
| 2008/0107423 A1* | 5/2008 | Lee | H04L 25/03343 398/136 |
| 2014/0147128 A1* | 5/2014 | Han | H05K 1/0251 398/135 |
| 2015/0316732 A1* | 11/2015 | Schamuhn | G02B 6/4284 398/139 |
| 2015/0351690 A1* | 12/2015 | Toth | A61B 5/6833 600/373 |

FOREIGN PATENT DOCUMENTS

| | | |
|---|---|---|
| CN | 103257413 A | 8/2013 |
| TW | 569051 B | 1/2004 |

* cited by examiner

*Primary Examiner* — Ted Wang
(74) *Attorney, Agent, or Firm* — Huffman Law Group, PC

(57) ABSTRACT

The present invention provides a package framework for a photoelectric conversion module, in which a photoelectric device is mounted on a printed circuit board such as a rigid-flex PCB and a HDI (High Density Interconnect) PCB, and then is connected, via a flexible printed circuit board, to a traditional printed circuit board having a driver chip or a digital signal processing integrated circuit disposed thereon. The present invention can prevent signal transmission interference caused by using bond wire, and can also maintain the stability of mechanical structure.

13 Claims, 12 Drawing Sheets

PACKAGE FRAMEWORK FOR PHOTOELECTRIC CONVERSION MODULE

CROSS REFERENCE

This application claims the priority of Taiwan Patent Application No. 104137030, filed on Nov. 10, 2015.

TECHNICAL FIELD OF THE INVENTION

The present invention relates to a package framework, and more particularly, to a package framework for a photoelectric conversion module.

BACKGROUND OF THE INVENTION

Photoelectric conversion circuits are widely applied to optical communication modules. The transmission bandwidth of the optical communication modules is increased as the demand on data transmission is increased day by day. To meet the requirements of wide bandwidth transmission, the conversion circuit needs to maintain the loss in energy conversion as low as possible even when the transmission frequency is increased and a stable mechanical structure has to be provided such that the coupler of optical signals and electronic signals can carry out high efficient signal transmission.

FIG. 1 is a schematic diagram showing a conventional package framework for an optical communication module. As shown in FIG. 1, there has a driver chip 11 and a photoelectric element 12 disposed on a printed circuit board (PCB) 13. Bond wires are used between the photoelectric element 12 and the PCB 13 to accomplish the transmission of electronic signals therebetween. The bond wires are also used between the photoelectric element 12 and the driver chip 11 to accomplish the transmission of electronic signals therebetween. After the photoelectric element 12 converts the electronic signals into optical signals, the optical signals are transmitted to an optical fiber 15 via an optical prism 14, and then the optical fiber 15 carries the optical signals and transmits them to an external device. External optical signals carried by the optical fiber 15 can also be transmitted to the photoelectric element 12 via the optical prism 14, and then the photoelectric element 12 converts the optical signals into electronic signals.

In the optical communication module shown in FIG. 1, the bond wires are used between the photoelectric element 12 and the driver chip 11 or between the photoelectric element 12 and the PCB 13 to carry the transmission of electronic signals therebetween. However, the inductance of the bond wires limits the transmission bandwidth, and electromagnetic interference is occurred easily because of that. Further, the bond wires have a large variation during their manufacture processes, and therefore energy reflection and loss will be occurred in wide bandwidth transmission, thereby resulting in unable to increasing the data rate using the optical communication module. Further, because the photoelectric element 12 is mounted on the PCB 13, the transmission path of optical signals between the photoelectric element 12 and the optical fiber 15 has to be bent at an angle of 90 degrees. This is why the optical prism 14 is required. However, this increases the complexity of assembly and the manufacture cost.

FIG. 2 is a schematic diagram showing another conventional package framework for an optical communication module. The optical communication module shown in FIG. 2 adopts VCSEL/PD (Vertical-Cavity Surface-Emitting Laser/photodiode) as a photoelectric element 22. The photoelectric element 22 will produce a great deal of heat when it is running. Therefore, the photoelectric element 22 is generally connected to a carrier 24 via solder balls and then the carrier 24 is connected to a PCB 23 via a submount 27 such as a silicon optical bench (SiOB). However, the bond wires are still used to transmit the electronic signals between the driver chip 21 and the carrier 24 connected to the photoelectric element 22 or between the driver chip 21 and the processor chip 26 or other chips, and therefore the afore-mentioned problem of energy reflection and loss may still exist using the bond wires in wide bandwidth transmission. In addition, as to the example illustrated in FIG. 2, the optical signal transmission between the photoelectric element 22 and the optical fiber 25 uses an oblique surface formed on the submount 27 to change the path of optical signals. However, the volume of the submount 27 is quite large and it may affect the package density of the printed circuit board 23.

FIG. 3 is a signal characteristic diagram for the signals transmitted using a bond wire. The impedance of the bond wire is uncontrollable. When the frequency of signal is increased, the effect caused by impedance mismatch becomes more serious, and therefore the reflection coefficient (S11, solid line in FIG. 3) of the signals is increased as the frequency increases. This makes the energy all reflected from the input port to the signal source. In addition, resonance will occur at a specific frequency for the bond wire. This results in rapidly increasing insertion loss (S21, dash line in FIG. 3), and therefore the energy cannot be passed to the optical element by the driver circuit.

FIG. 4 is a schematic diagram showing a conventional package framework for a multichannel optical communication module. The multichannel optical communication module shown in FIG. 4 has two signal channels, for example. The channels have different transmission data. Each channel correspondingly has a TX optical element and a RX optical element. The TX optical element on the submount is connected to a corresponding TX junction point on the wafer by use of bond wire. The RX optical element on the submount is connected to a corresponding RX junction point on the wafer by use of bond wire. FIG. 4 merely illustrates the connections of the TX optical element and the RX optical element corresponding to a single channel. The corresponding connections for other channels are similar or the same. The conventional multichannel optical communication module with also uses the bond wires for electronic signal transmission. Said optical communication module generally has two or more than two TX and RX optical elements but the bond wires have not been shielded, and therefore coupling of the electronic signals will be occurred therebetween, resulting in abnormal signal transmission.

Further, please refer to FIG. 5, which is a spectrogram obtained at bond wires of a traditional photoelectric conversion circuit. The traditional photoelectric conversion circuit uses the bond wire for electronic signal transmission. However, the bond wire will generate strong radiation in high frequency signal transmission. This may also make the neighboring bond wire able to sense that energy and may cause maloperation of other integrated circuits. As shown in FIG. 5, the driver circuit at TX end is connected to the optical coupling element via the bond wire and TX end generates a strong electric field. RX end of the optical coupling element transmits the electronic signals to an amplifier circuit via the bond wire but meanwhile this bond wire will sense the energy from TX end due to electromagnetic coupling. This may cause maloperation of the circuits at RX end.

SUMMARY OF THE INVENTION

An objective of the present invention is to provide a package framework for photoelectric conversion module, for solving the problems of signal interference and limit of transmission bandwidth, caused by adopting bond wire to connect an optical device and a printed circuit board (or a driver chip) in conventional skills.

To achieve above objective, the present invention provides a package framework for a photoelectric conversion module, comprising: a first printed circuit board; a second printed circuit board; a flexible printed circuit board, one end thereof being connected to the first printed circuit board while the other end being connected to the second printed circuit board, the flexible printed circuit board having a plurality of signal lines, which construct signal transmission paths between the first printed circuit board and the second printed circuit board; an optical device mounted on the second printed circuit board, for converting electronic signals into optical signals and converting the optical signals into the electronic signals; and a driver chip mounted on the first printed circuit board, for processing the electronic signals transmitted from the optical device and the electronic signals that are to be transmitted to the optical device; wherein the optical device receives the optical signals transmitted from outside and converts the optical signals into the electronic signals, and after that, the electronic signals are transmitted to the driver chip sequentially via the second printed circuit board, the flexible printed circuit board, and the first printed circuit board; the optical device converts the electronic signals transmitted from the driver chip sequentially via the first printed circuit board, the flexible printed circuit board, and the second printed circuit board, into the optical signals, and then the optical signals are transmitted to an external device.

Another aspect of the present invention provides a package framework for a photoelectric conversion module, comprising: a first printed circuit board; a second printed circuit board; a flexible printed circuit board, one end thereof being connected to the first printed circuit board while the other end being connected to the second printed circuit board, the flexible printed circuit board having a plurality of signal lines, which construct signal transmission paths between the first printed circuit board and the second printed circuit board; an optical device mounted on the second printed circuit board, the optical device comprising an optical transmitter and an optical receiver, the optical receiver being used to receive optical signals transmitted from outside and converts the optical signals into electronic signals, the optical transmitter being used to convert the electronic signals into the optical signals and transmit the optical signals to an external device; an optical connector connected to the optical device; an optical fiber coupled to the optical connector; and a driver chip mounted on the first printed circuit board, for processing the electronic signals transmitted from the optical device and the electronic signals that are to be transmitted to the optical device; wherein external optical signals carried by the optical fiber are coupled to the optical connector and then are transmitted to the optical receiver of the optical device, and the optical signals are then converted by the optical device into the electronic signals, which are then transmitted to the driver chip sequentially via the second printed circuit board, the flexible printed circuit board, and the first printed circuit board; the electronic signals emitted from the driver chip are transmitted to the optical device sequentially via the first printed circuit board, the flexible printed circuit board, and the second printed circuit board, and the electronic signals are then converted by the optical device into the optical signals, which are then transmitted by the optical transmitter of the optical device to the optical fiber via the optical connector, and the optical fiber carries the optical signals and transmits them to the external device.

In the package framework for the photoelectric conversion module in accordance with the present invention, the optical device is mounted on the second printed circuit board and is then connected, via the flexible printed circuit board, to the first printed circuit board having the driver chip mounted thereon. Such a connection completely discards the use of bond wire. Compared to connecting the optical device and the printed circuit board (or the driver chip) by use of the wire bond in the conventional skills, the package framework of the present invention can discard the use of bond wire, lower the signal interference, and enhance transmission bandwidth of the photoelectric conversion module. Further, the package framework of the present invention adopts the flexible printed circuit board to connect the optical device and the first printed circuit board, and therefore it is convenient to align the optical device with the optical connector without the use of an optical prism in the conventional skills. This reduces the complexity of assembly and the manufacture cost is lowered as well. In addition, the optical device of the present invention is mounted on the second printed circuit board, rather than on the first printed circuit board, and therefore heat load caused by lots of elements disposed on the first printed circuit board can be moderated. The heat sources are dispersed. In addition, in a package framework for a photoelectric conversion module in accordance with the present invention, the flexible printed circuit board has a decoupling circuit disposed thereon, which can relieve the coupling effects between various signal transmission channels and efficiently reduce the electromagnetic interferences caused in energy conversion.

DETAILED DESCRIPTION OF THE INVENTION

To make the objectives, technical schemes, and technical effects of the present invention more clearly and definitely, the present invention will be described in detail below by using embodiments in conjunction with the appending drawings. It should be understood that the specific embodiments described herein are merely for explaining the present invention, and as used herein, the term "embodiment" refers to an instance, an example, or an illustration but is not intended to limit the present invention. In addition, the articles "a" and "an" as used in the specification and the appended claims should generally be construed to mean "one or more" unless specified otherwise or clear from the context to be directed to a singular form. Also, in the appending drawings, the components having similar or the same structure or function are indicated by the same reference number.

The present invention relates to a package framework for a photoelectric conversion module, which is distinguished from the traditional package framework using bond wire to connect a photoelectric device (e.g., an optical communication component) and a digital signal processing integrated circuit (e.g., a driver chip) with a printed circuit board (PCB) having the digital signal processing integrated circuit disposed thereon. The package framework implemented according to the present invention is to mount the photoelectric device on a printed circuit board (e.g., a rigid-flex PCB) or a HDI (High Density Interconnect) printed circuit board, which is then connected, via a flexible printed circuit board (FPCB), to a traditional printed circuit board having the digital signal processing integrated circuit disposed thereon. Such a connection in accordance with the present invention can prevent signal transmission interference caused by using the bond wire, and can also maintain the stability of mechanical structure. Further, another advantage of such a package framework in accordance with the present invention is that it is convenient to deploy a decoupling circuit, thereby reducing the signal interference and relieving the coupling effect that may be occurred in the signal transmission path. These features of the present invention can enhance the transmission bandwidth of the photoelectric conversion module, and is further suitable for high-frequency signal transmission. Therefore, the package framework for the photoelectric conversion module in accordance with the present invention is preferably applicable to the technical fields of optical communication, high-speed signal transmission, high-frequency circuits, signal integrity enhancement, and electronic packaging and test.

Figure 6A:
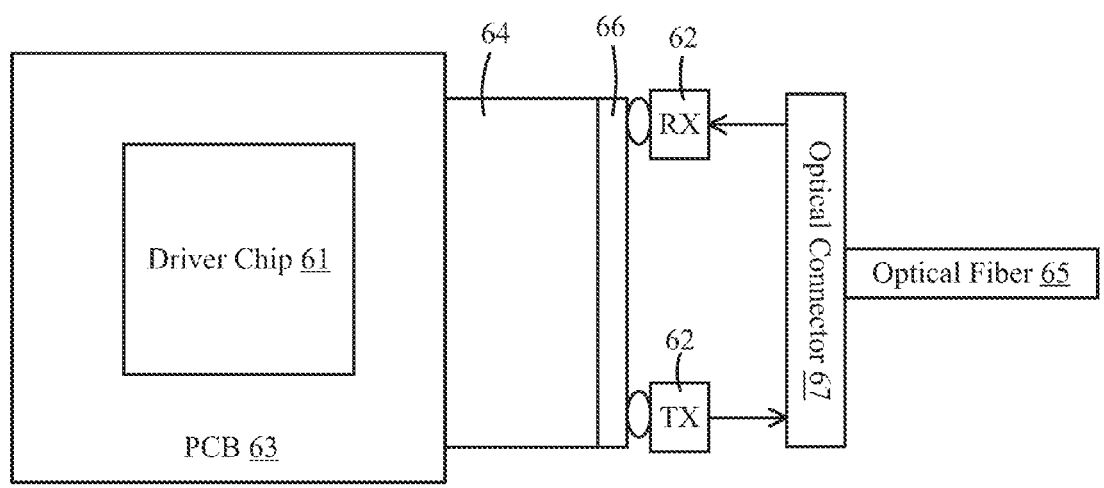
FIG. 6A is a top view of a package framework for a photoelectric conversion module in accordance with the present invention.
Figure 6B:
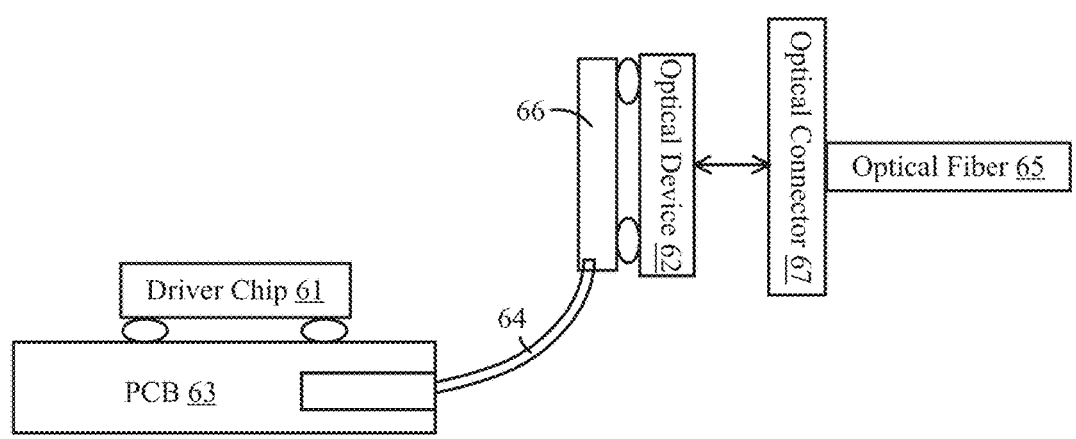
FIG. 6B is a side view of the package framework for the photoelectric conversion module in accordance with the present invention.

Referring to FIG. 6A and FIG. 6B, FIG. 6A is a top view of a package framework for a photoelectric conversion module in accordance with the present invention; FIG. 6B is a side view of the package framework for the photoelectric conversion module in accordance with the present invention. The package framework for the photoelectric conversion module in accordance with the present invention comprises a digital signal processing integrated circuit or a driver chip 61, an optical device 62, a first printed circuit board (PCB) 63, a flexible printed circuit board 64, an optical fiber 65, a second printed circuit board 66, and an optical connector 67. The optical device 62 comprises an optical transmitter TX and an optical receiver RX. The number of the optical transmitter TX and the optical receiver RX is not limited to one set. FIG. 6A and FIG. 6B are merely for illustration. There can also have a plurality of sets of the optical transmitter TX and the optical receiver RX, and they carry out multichannel optical signal transmission. That is to say, the optical device 62 can transmit or receive the optical signals in a time division manner or a wave division manner under different frequency ranges.

The driver chip 61 is mounted on the first printed circuit board 63. The connection between the driver chip 61 and the first printed circuit board 63 may be carried out by flip-chip packaging or ball grid array (BGA) packaging but is not limited thereto. The driver chip 61 may also be three-dimensional stacked with other chip modules, and then is connected to the first printed circuit board 63. Also, the present invention may deploy the driver chip 61 and the first printed circuit board 63 by adopting chip designs, packaging technologies, and connection approaches of the chip and the printed circuit board that are already existed or are developed in the future. The driver chip 61 is used to process the electronic signals transmitted from the optical device 62 and the electronic signals that are to be transmitted to the optical device 62. The driver chip 61 can be a digital signal processing integrated circuit but is not limited thereto. The package framework for the photoelectric conversion module in accordance with the present invention may also comprise a processing chip (not shown) for providing calculations or computations required by the driver chip 61. Of course, the driver chip 61 may be equipped with simple calculation ability, and complicated calculations are left to the processing chip.

One end of the flexible printed circuit board 64 is connected to the first printed circuit board 63, and the other end is connected to the second printed circuit board 66. The flexible printed circuit board 64 has a plurality of signal lines, which construct signal transmission paths between the first printed circuit board 63 and the second printed circuit board 66. The first printed circuit board 63 and the second printed circuit board 66 can be a multi-layer printed circuit board but is not limited thereto. The junction points at the lateral side of the flexible printed circuit board 64 may be connected with the junction points on the surfaces of the first printed circuit board 63 and the second printed circuit board 66, or be connected with connectors or connection ports disposed on the surfaces or later surfaces of the first printed circuit board 63 and the second printed circuit board 66.

The optical device 62 is mounted on the second printed circuit board 66. The optical device 62 is used to convert the electronic signals into optical signals and convert the optical signals into electronic signals. Specifically, the optical receiver RX of the optical device 62 can receive the optical signals transmitted from outside and convert the optical signals into electronic signals. After that, the electronic signals are transmitted to the driver chip 61 sequentially via the second printed circuit board 66, the flexible printed circuit board 64, and the first printed circuit board 63. The optical transmitter TX of the optical device 62 can convert the electronic signals transmitted from the driver chip 61 sequentially via the first printed circuit board 63, the flexible printed circuit board 64, and the second printed circuit board 66, into optical signals, and then the optical signals are transmitted to an external device. The optical device 62 can be an optical communication element and preferably be carried out by an optical communication element with 100 Gbps of transmission bandwidth, but is not limited thereto. For example, the optical device 62 can be an optical device of VCSEL/PD (Vertical-Cavity Surface-Emitting Laser/photodiode) type. Also, the present invention may deploy the optical device 62 and the second printed circuit board 66 by adopting chip designs, packaging technologies, and connection approaches of the chip and the printed circuit board that are already existed or are developed in the future.

For instance, the second printed circuit board 66 can be a rigid-flex printed circuit board or a HDI printed circuit board. The rigid-flex printed circuit board may be used to transmit high frequency or wide bandwidth signals after designed appropriately. Generally, the HDI printed circuit board inherently has the ability to transmit high frequency or wide bandwidth signals. Generally speaking, the rigid-flex printed circuit board serving as the second printed circuit board 66 is applicable to low end photoelectric conversion module or that only requires a small number of channels. The HDI printed circuit board serving as the second printed circuit board 66 is applicable to high end photoelectric conversion module or that requires a large number of channels or requires high quality of channels. The HDI printed circuit board comparably meets the requirements if the package framework for the photoelectric conversion module in accordance with the present invention is applied to high end optical communication products.

The optical device 62 is connected to the optical connector 67, which is coupled to the optical fiber 65. The optical signals coming from outside are carried by the optical fiber 65 and are transmitted to the optical receiver RX of the optical device 62 via the optical connector 67. The optical signals emitted from the optical transmitter TX of the optical device 62 are also carried by the optical fiber 65 and are transmitted to an external device via the optical connector 67. The optical connector 67 serves as an intermediary structure and is a structural element providing signal coupling for the optical fiber 65 and the optical device 62.

In an aspect of signal transmission path, external optical signals carried by the optical fiber 65 are coupled to the optical connector 67 and then are transmitted to the optical receiver RX of the optical device 62. Such optical signals are converted by the optical device 62 into electronic signals, which are then transmitted to the driver chip 61 sequentially via the second printed circuit board 66, the flexible printed circuit board 64, and the first printed circuit board 63. Electronic signals emitted from the driver chip 61 are transmitted to the optical device 62 sequentially via the first printed circuit board 63, the flexible printed circuit board 64, and the second printed circuit board 66, and such electronic signals are converted by the optical device 62 into optical signals. The optical signals are transmitted by the optical transmitter TX of the optical device 62 to the optical fiber 65 via the optical connector 67. The optical fiber 65 carries the optical signals and transmits them to an external device.

In the package framework for the photoelectric conversion module in accordance with the present invention, the optical device 62 is mounted on the second printed circuit board 66 and is then connected, via the flexible printed circuit board 64, to the first printed circuit board 63 having the driver chip 61 mounted thereon. Such a connection completely discards the use of wire bond. Compared to connecting the optical device and the printed circuit board (or the driver chip) by use of the wire bond in the conventional skills, the package framework of the present invention can discard the use of bond wire, lower the signal interference, and enhance transmission bandwidth of the photoelectric conversion module. Further, the package framework of the present invention adopts the flexible printed circuit board 64 to connect the optical device 62 and the first printed circuit board 63, and therefore it is convenient to align the optical device 62 with the optical connector 67 without the use of an optical prism in the conventional skills. This reduces the complexity of assembly and the manufacture cost is lowered as well. In addition, the optical device 62 of the present invention is mounted on the second printed circuit board 66, rather than on the first printed circuit board 63, and therefore heat load caused by lots of elements disposed on the first printed circuit board 63 can be moderated. The heat sources are dispersed.

Figure 7:
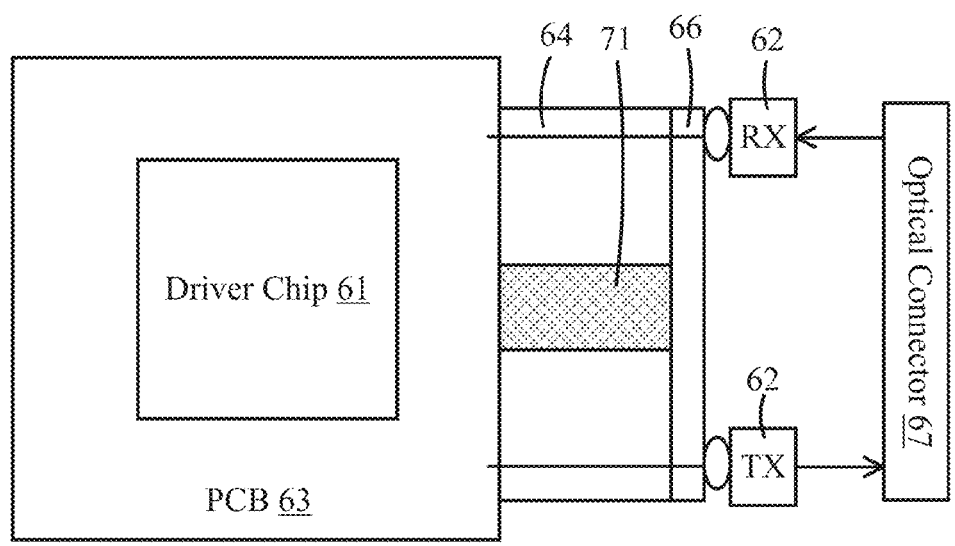
FIG. 7 is a schematic diagram showing a package framework for a photoelectric conversion module in accordance with another embodiment of the present invention.
Figure 8B:
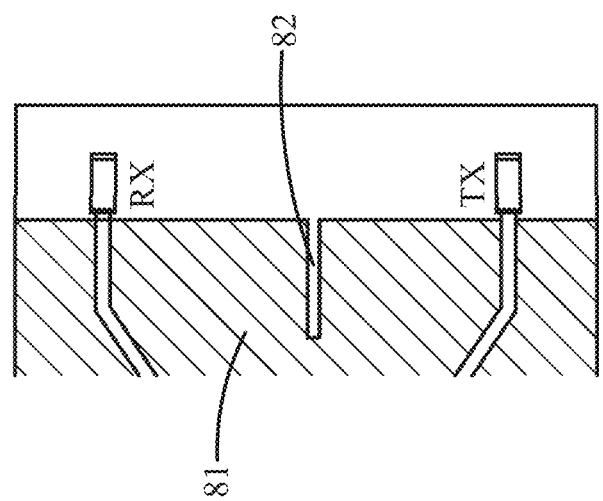
FIG. 8B is a schematic diagram showing another example of a decoupling circuit of the present invention.
Figure 8A:
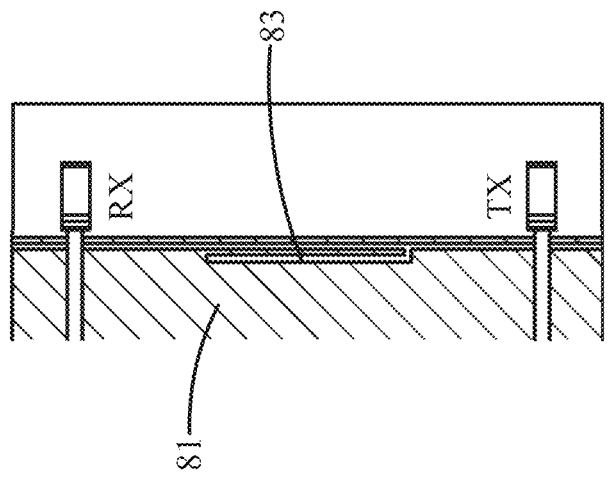
FIG. 8A is a schematic diagram showing an example of a decoupling circuit of the present invention.

FIG. 7 is a schematic diagram showing a package framework for a photoelectric conversion module in accordance with another embodiment of the present invention. In the package framework shown in FIG. 7, the flexible printed circuit board 64 has a decoupling circuit 71 disposed thereon for relieving the coupling effects between various signal transmission channels. FIG. 8A is a schematic diagram showing an example of the decoupling circuit 71 of the present invention. FIG. 8B is a schematic diagram showing another example of the decoupling circuit 71 of the present invention. As shown in FIG. 8A, the flexible printed circuit board 64 has a ground electrode 81 disposed thereon. The ground electrode 81 has a slot 82 disposed between two signal lines of the flexible printed circuit board 64. The slot 82 is a part where the material of the ground electrode 81 is removed. As shown in FIG. 8B, the flexible printed circuit board 64 has a band stop filter 83 fabricated on the ground electrode 81. The slot 82 shown in FIG. 8A and the band stop filter 83 shown in FIG. 8B can efficiently reduce the electromagnetic interferences caused in energy conversion.

Figure 1:
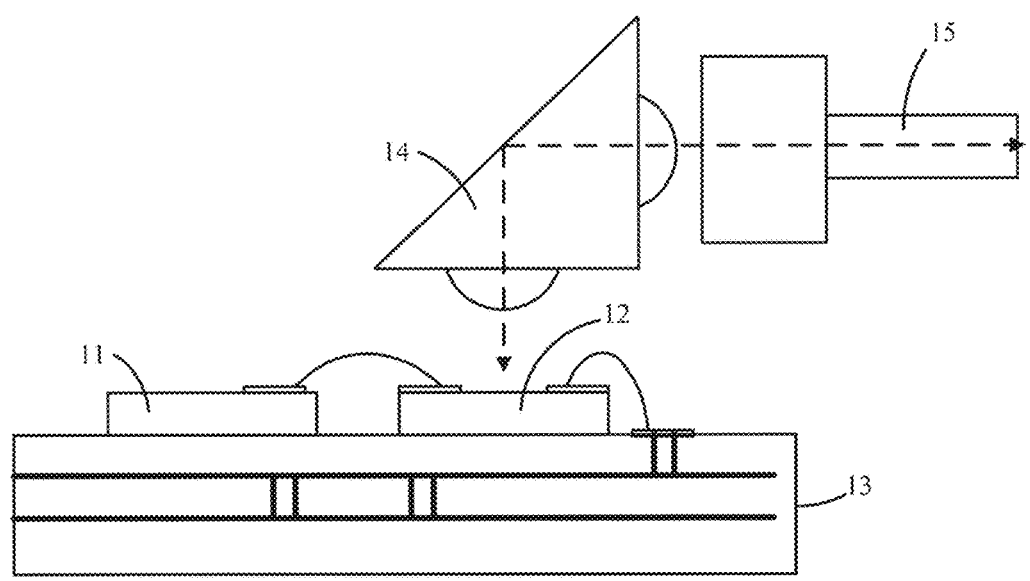
FIG. 1 is a schematic diagram showing a conventional package framework for an optical communication module.
Figure 2:
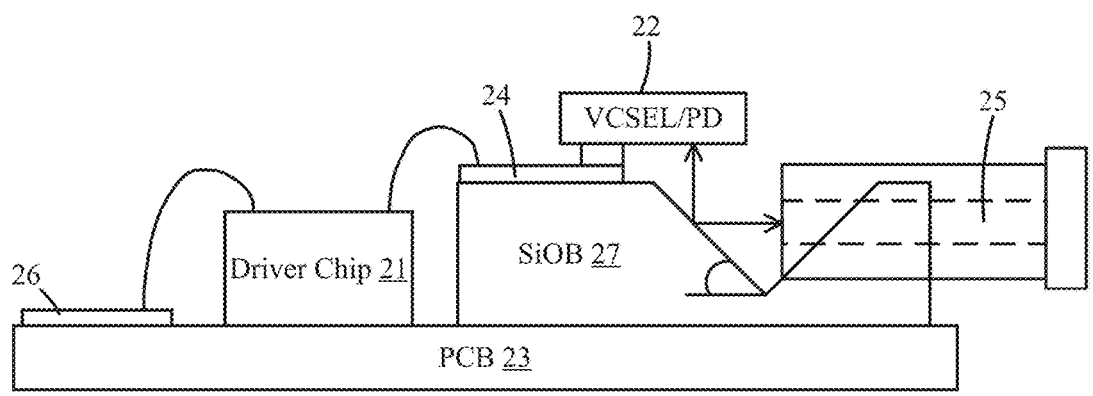
FIG. 2 is a schematic diagram showing another conventional package framework for an optical communication module.
Figure 3:
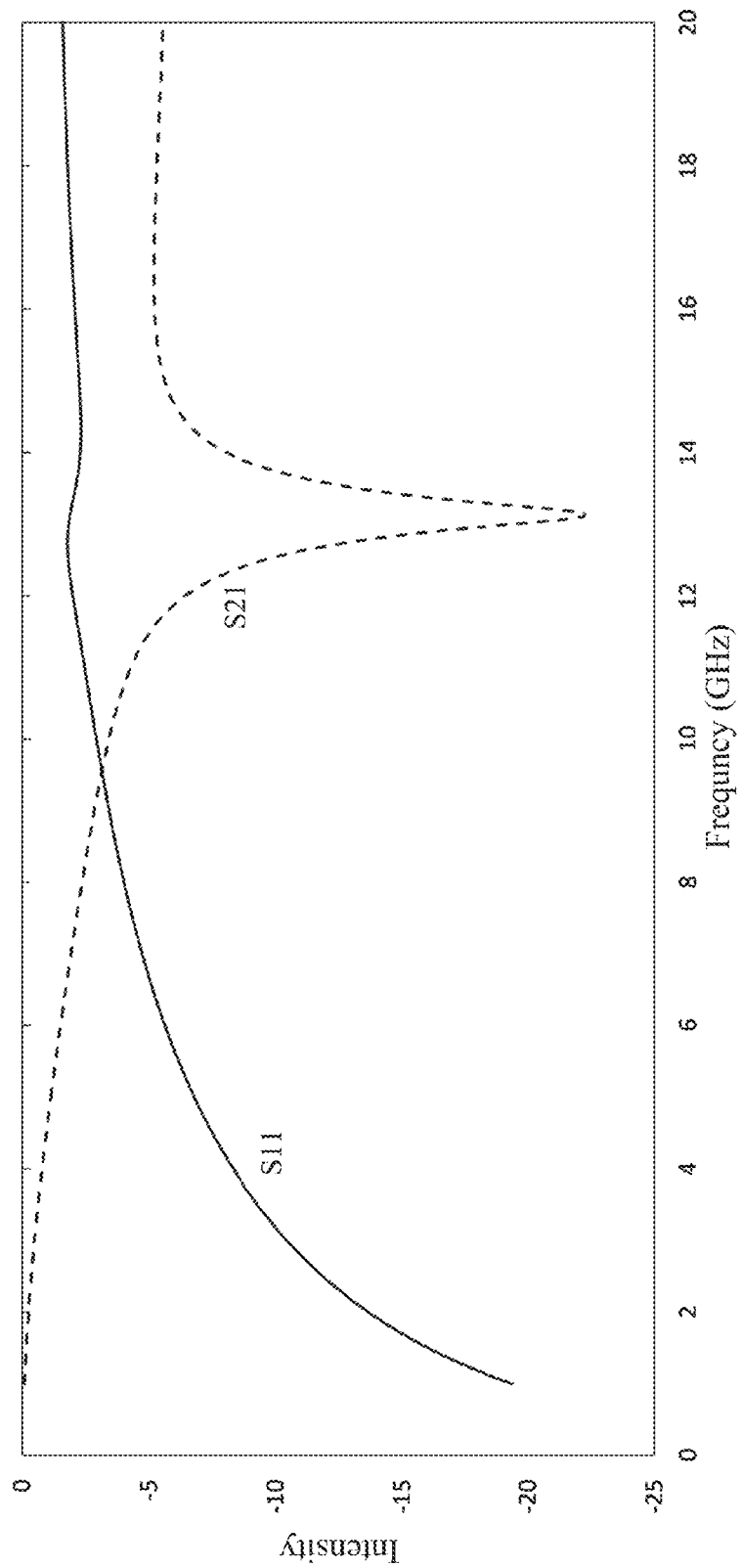
FIG. 3 is a signal characteristic diagram for the signals transmitted using a bond wire.
Figure 4:
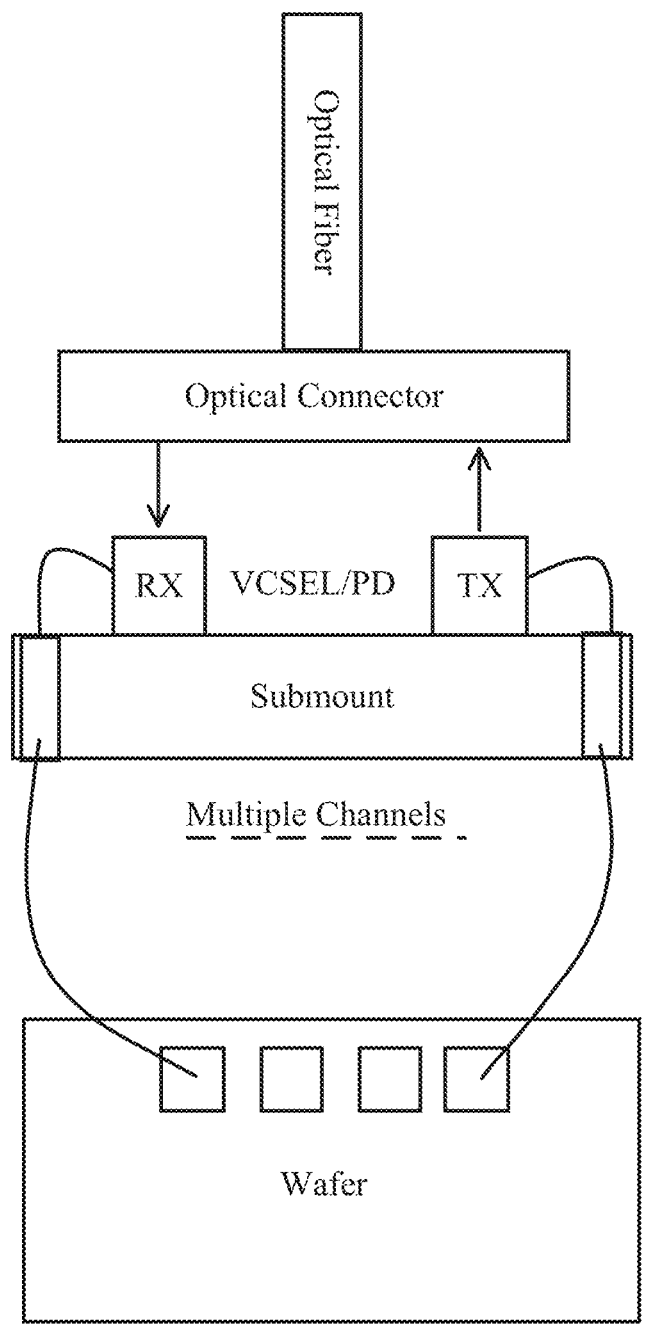
FIG. 4 is a schematic diagram showing a conventional package framework for a multichannel optical communication module.
Figure 5:
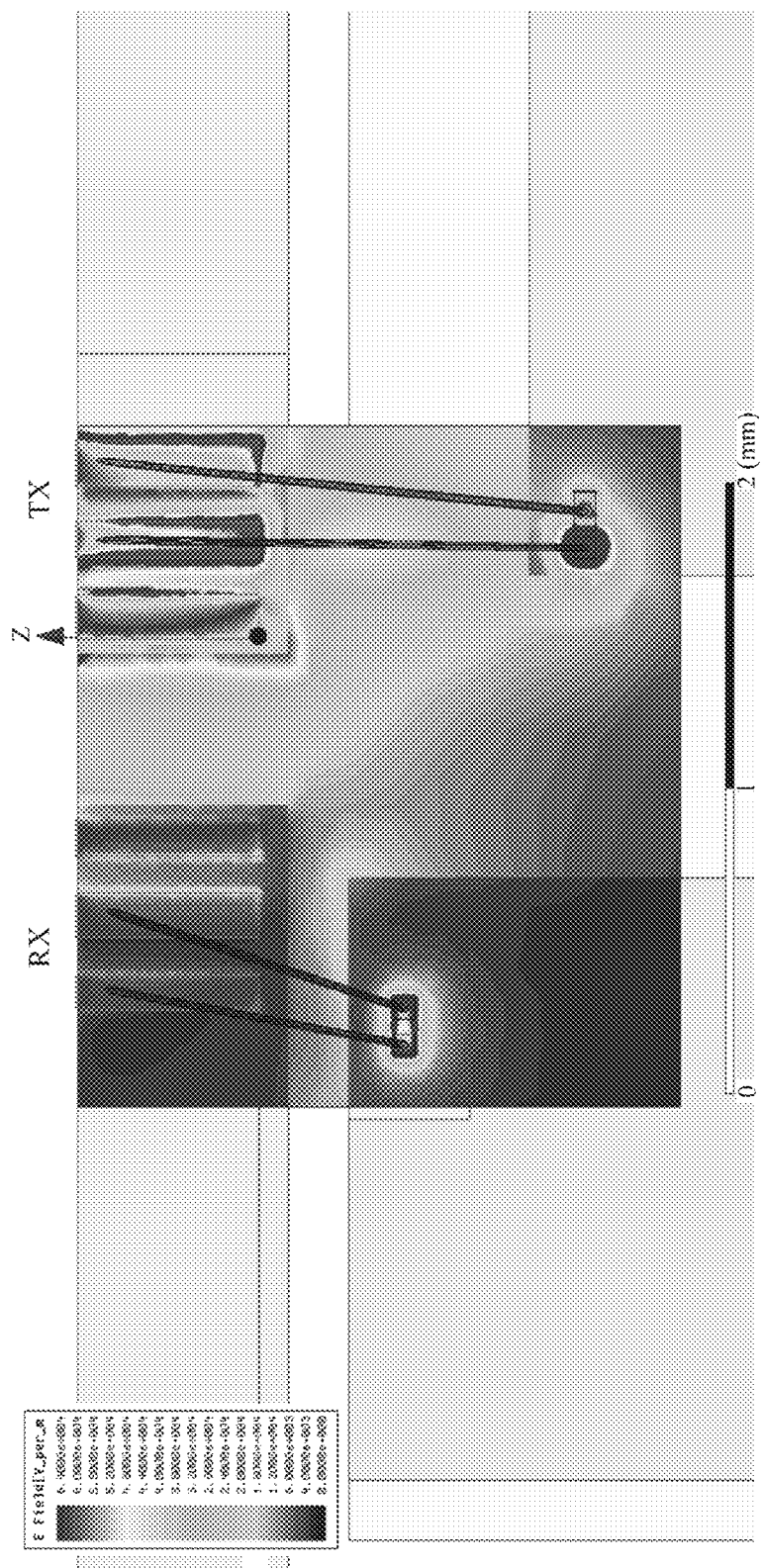
FIG. 5 is a spectrogram obtained at bond wires of a traditional photoelectric conversion circuit.
Figure 9:
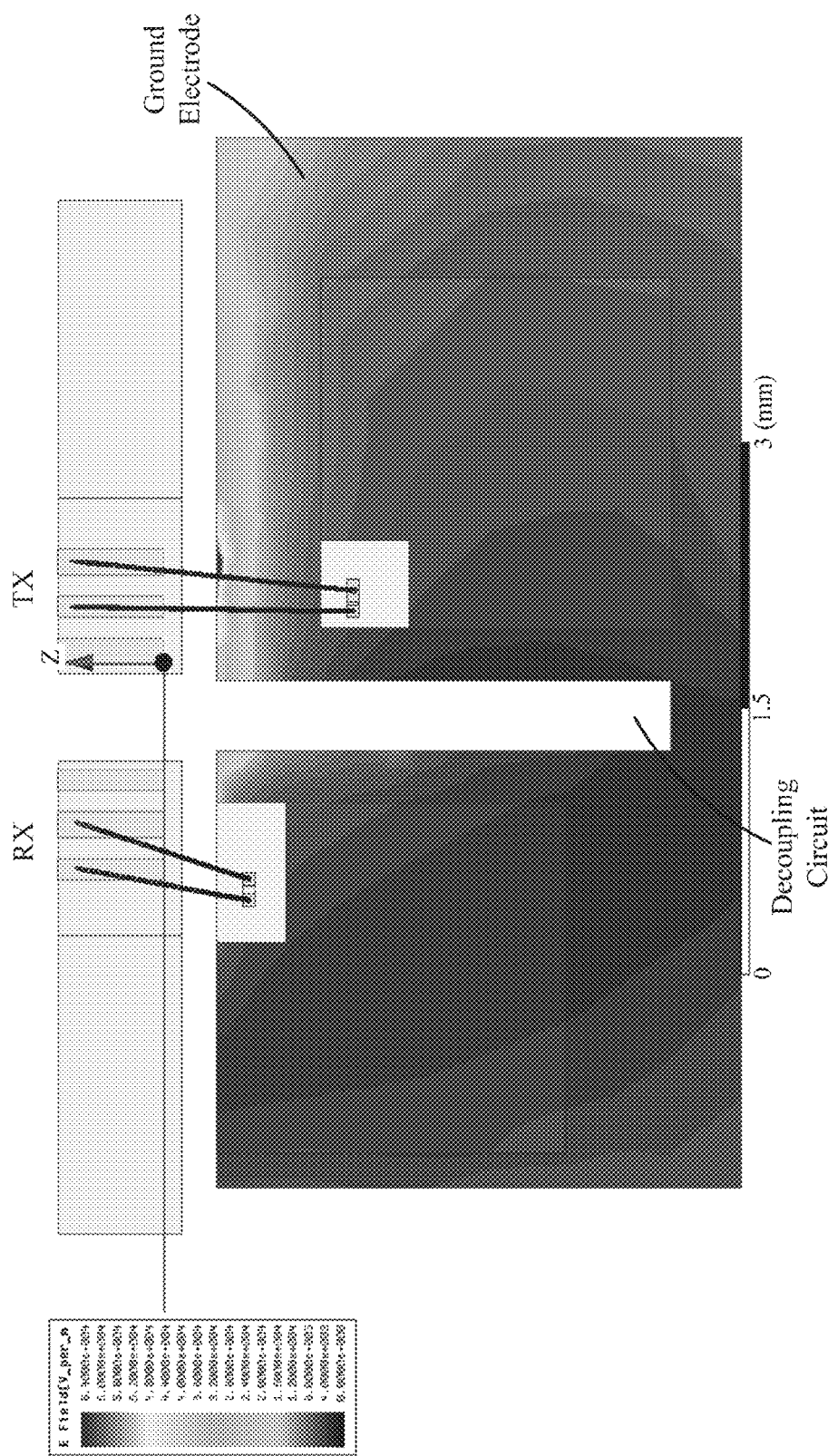
FIG. 9 is a spectrogram obtained at connection electrodes in a circumstance that a decoupling circuit is added to the package framework for the photoelectric conversion module in accordance with the present invention.
Figure 10A:
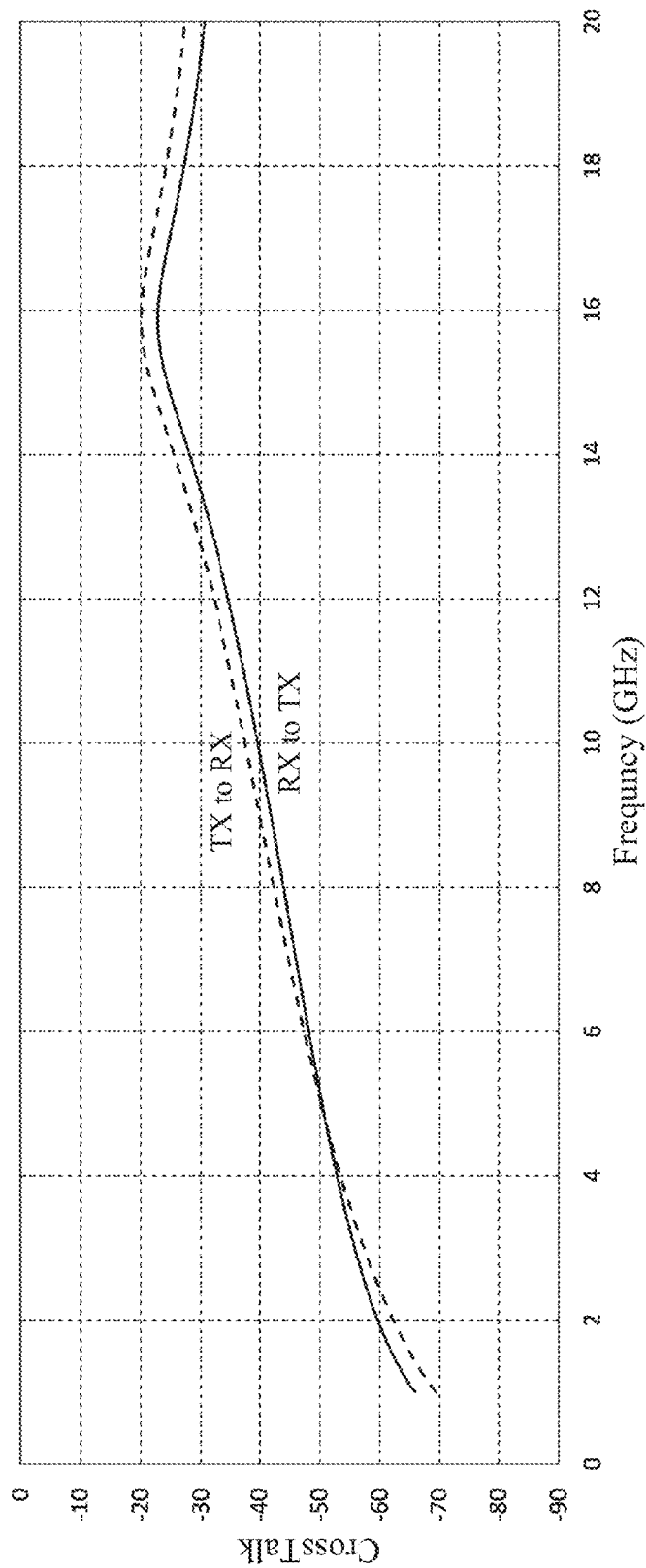
FIG. 10A is a signal isolation characteristic diagram for a photoelectric conversion module in a conventional package framework shown in FIG. 5.
Figure 10B:
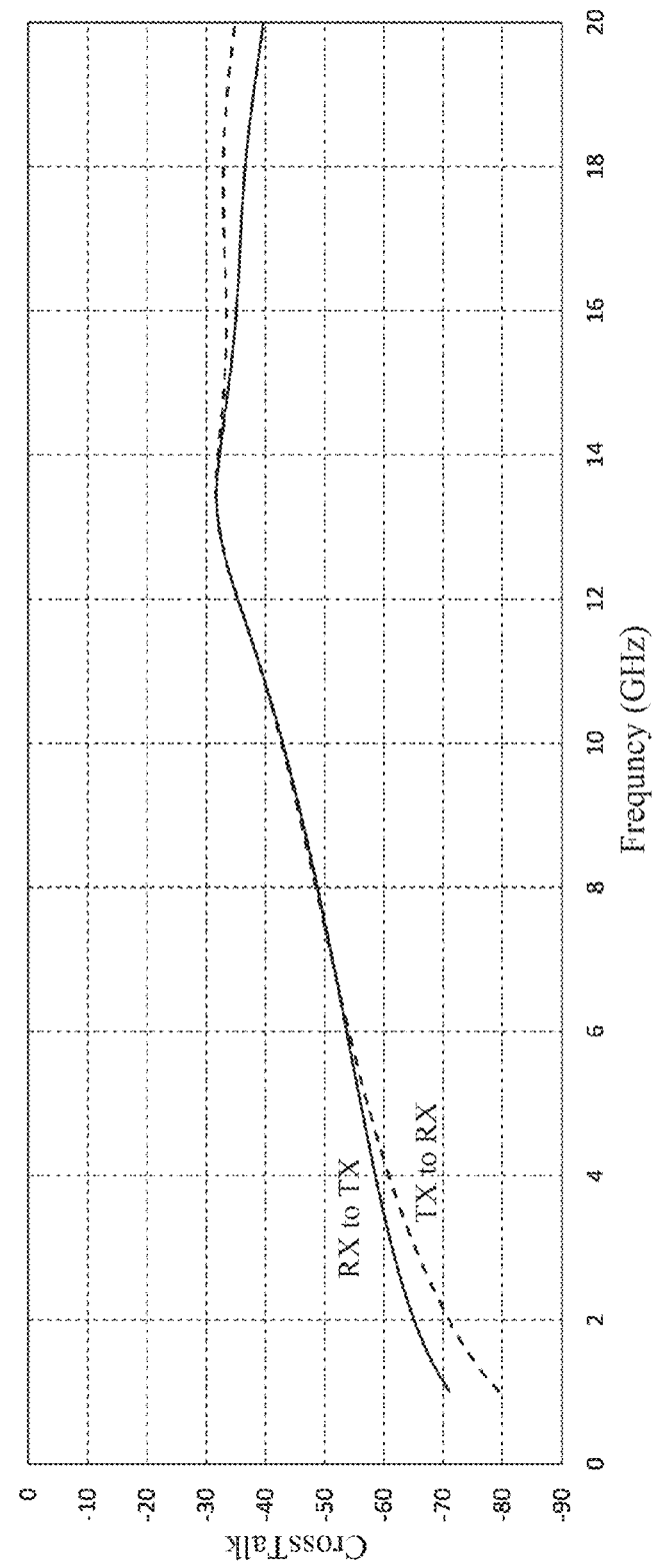
FIG. 10B is a signal isolation characteristic diagram for the photoelectric conversion module in the package framework with a decoupling circuit added as shown in FIG. 9 in accordance with the present invention.

FIG. 9 is a spectrogram obtained at connection electrodes in a circumstance that the decoupling circuit is added to the package framework for the photoelectric conversion module in accordance with the present invention. It can be known that the coupling effect between the connection electrodes is apparently relieved. FIG. 10A is a signal isolation characteristic diagram for a photoelectric conversion module in a conventional package framework shown in FIG. 5. FIG. 10B is a signal isolation characteristic diagram for the photoelectric conversion module in the package framework with the decoupling circuit added as shown in FIG. 9 in accordance with the present invention. As can be seen from FIG. 10A and FIG. 10B, the present invention can reduce the electromagnetic interferences caused between the signals and improve the isolation from −20 dB to −31 dB after the decoupling circuit is added, as compared to the conventional skills.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A package framework for a photoelectric conversion module, comprising:
   a first printed circuit board;
   a second printed circuit board;
   a flexible printed circuit board, one end thereof being connected to the first printed circuit board while the other end being connected to the second printed circuit board, the flexible printed circuit board having a plurality of signal lines, which construct signal transmission paths between the first printed circuit board and the second printed circuit board, wherein the flexible printed circuit board has a ground electrode disposed thereon, and the ground electrode has a band stop filter fabricated thereon;
   an optical device mounted on the second printed circuit board, for converting electronic signals into optical signals and converting the optical signals into the electronic signals; and
   a driver chip mounted on the first printed circuit board, for processing the electronic signals transmitted from the optical device and the electronic signals that are to be transmitted to the optical device;
   wherein the optical device receives the optical signals transmitted from outside and converts the optical signals into the electronic signals, and after that, the electronic signals are transmitted to the driver chip sequentially via the second printed circuit board, the flexible printed circuit board, and the first printed circuit board; the optical device converts the electronic signals transmitted from the driver chip sequentially via the first printed circuit board, the flexible printed circuit board, and the second printed circuit board, into the optical signals and then the optical signals are transmitted to an external device.

2. The package framework according to claim 1, wherein the second printed circuit board comprises a rigid-flex printed circuit board.

3. The package framework according to claim 1, wherein the second printed circuit board comprises a HDI (High Density Interconnect) printed circuit board.

4. The package framework according to claim 1, wherein the optical device comprises an optical transmitter and an optical receivers, is used to receive the optical signals transmitted from outside and converts the optical signals into the electronic signals, and the optical transmitter is used to convert the electronic signals into the optical signals and transmit the optical signals to the external device.

5. The package framework according to claim 1, wherein the optical device comprises a plurality of sets of the optical transmitters and the optical receivers, and multichannel optical signal transmission is carried out by the optical transmitters and optical receivers.

6. The package framework according to claim 1, further comprising:
   an optical connector connected to the optical device; and
   an optical fiber coupled to the optical connector;
   wherein the optical signals coming from outside are carried by the optical fiber and are transmitted to the optical device via the optical connector, and the optical signals emitted from the optical device are carried by the optical fiber and are transmitted to the external device via the optical connector.

7. The package framework according to claim 1, further comprising:
   a decoupling circuit disposed on the flexible printed circuit board, for reducing electromagnetic interference.

8. The package framework according to claim 7, wherein the flexible printed circuit board has a ground electrode disposed thereon, the ground electrode has a slot disposed between at least two signal lines of the flexible printed circuit board, and the slot is a part where a material of the ground electrode is removed.

9. The package framework according to claim 1, wherein the optical device comprises an optical communication element.

10. A package framework for a photoelectric conversion module, comprising:
    a first printed circuit board;
    a second printed circuit board;
    a flexible printed circuit board, one end thereof being connected to the first printed circuit board while the other end being connected to the second printed circuit board, the flexible printed circuit board having a plurality of signal lines, which construct signal transmission paths between the first printed circuit board and the second printed circuit board, wherein the flexible printed circuit board has a ground electrode disposed thereon, and the ground electrode has a band stop filter fabricated thereon;
    an optical device mounted on the second printed circuit board, the optical device comprising an optical transmitter and an optical receiver, the optical receiver being used to receive optical signals transmitted from outside and converts the optical signals into electronic signals, the optical transmitter being used to convert the electronic signals into the optical signals and transmit the optical signals to an external device;
    an optical connector connected to the optical device;
    an optical fiber coupled to the optical connector; and
    a driver chip mounted on the first printed circuit board, for processing the electronic signals transmitted from the optical device and the electronic signals that are to be transmitted to the optical device;
    wherein external optical signals carried by the optical fiber are coupled to the optical connector and then are transmitted to the optical receiver of the optical device, and the optical signals are then converted by the optical device into the electronic signals, which are then transmitted to the driver chip sequentially via the second printed circuit board, the flexible printed circuit board, and the first printed circuit board; the electronic signals emitted from the driver chip are transmitted to the optical device sequentially via the first printed circuit board, the flexible printed circuit board, and the second printed circuit board, and the electronic signals are then converted by the optical device into the optical signals, which are then transmitted by the optical transmitter of the optical device to the optical fiber via the optical connector, and the optical fiber carries the optical signals and transmits them to the external device.

11. The package framework according to claim 10, wherein the second printed circuit board comprises a rigid-flex printed circuit board.

12. The package framework according to claim 10, wherein the second printed circuit board comprises a HDI (High Density Interconnect) printed circuit board.

13. The package framework according to claim 10, wherein the flexible printed circuit board has a ground electrode disposed thereon, the ground electrode has a slot disposed between at least two signal lines of the flexible printed circuit board, and the slot is a part where a material of the ground electrode is removed.

* * * * *